United States Patent [19]

Wu

[11] Patent Number: 5,895,250
[45] Date of Patent: Apr. 20, 1999

[54] METHOD OF FORMING SEMICROWN-SHAPED STACKED CAPACITORS FOR DYNAMIC RANDOM ACCESS MEMORY

[75] Inventor: Neng-Wei Wu, Hsinchu, Taiwan

[73] Assignee: Vanguard International Semiconductor Corporation, Hsin-Chu, Taiwan

[21] Appl. No.: 09/096,046

[22] Filed: Jun. 11, 1998

[51] Int. Cl.⁶ .................................................... H01L 21/20
[52] U.S. Cl. ........................ 438/396; 438/397; 438/253; 438/254
[58] Field of Search ................................. 438/253, 254, 438/256, 396, 397, 399; 148/DIG. 14; 257/68, 71

[56] References Cited

U.S. PATENT DOCUMENTS

| | | | |
|---|---|---|---|
| 5,270,241 | 12/1993 | Dennison et al. | 437/52 |
| 5,389,568 | 2/1995 | Yun | 438/396 |
| 5,444,005 | 8/1995 | Kim et al. | 437/52 |
| 5,543,345 | 8/1996 | Liaw et al. | 437/52 |
| 5,597,755 | 1/1997 | Ajika et al. | 438/396 |
| 5,604,146 | 2/1997 | Tseng | 437/52 |
| 5,737,577 | 4/1998 | Cherng | 438/396 |
| 5,776,815 | 7/1998 | Pan et al. | 438/396 |

Primary Examiner—Tuan H. Nguyen
Attorney, Agent, or Firm—George O. Saile; Stephen B. Ackerman

[57] ABSTRACT

A method for making semicrown stacked capacitors for DRAM devices is achieved. A first insulating layer, a second insulating etch-stop layer, and a high-etch-rate third insulating layer are sequentially formed on a substrate over the memory cell areas having FETs with source/drain areas. Recesses are etched in the third and second insulating layers for bottom electrodes, aligned over device areas. Node contact openings are plasma etched in the first insulating layer exposed in the recesses to one of each source/drain area. A first polysilicon layer is deposited to form node contacts and the bottom electrodes. A high-etch-rate fourth insulating layer is used to fill the recesses. The fourth insulating layer and the first polysilicon layer are etched or chem/mech polished back to form the array of bottom electrodes having oxide plugs. The plugs and third insulating layer are wet etched to the etch-stop layer to form the semicrown bottom electrodes. A thin dielectric layer is deposited, and a patterned second polysilicon layer is formed for top electrodes. The etch-stop layer, retained in the final structure, supports the bottom electrodes to reduce mechanical damage during subsequent processing and to also reduce the nonuniformity across the substrate for an improved photolithographic process window.

30 Claims, 3 Drawing Sheets

METHOD OF FORMING SEMICROWN-SHAPED STACKED CAPACITORS FOR DYNAMIC RANDOM ACCESS MEMORY

BACKGROUND OF THE INVENTION (1) Field of the Invention

This invention relates to an integrated circuit semiconductor device, and more particularly to a method for fabricating an array of memory cells for dynamic random access memory (DRAM) devices with semicrown-shaped capacitors having increased capacitance.

(2) Description of the Prior Art

The integrated circuit density on chips formed on semiconductor substrates has dramatically increased in recent years. The increase in density is the result of scaling down the individual semiconductor devices built in and on the substrate.

One circuit type experiencing this demand for increased circuit density and the need for an essentially planar surface is the dynamic random access memory (DRAM) chip (or devices) made on a semiconductor substrate. The DRAM chip areas on the substrate consist of an array of closely spaced memory cells with address and read/write circuits along the periphery of the chip. Currently in production there are 64 million memory cells on a DRAM chip with minimum features sizes less than a half micrometer. The individual memory cells are formed from a single access transistor, typically a field effect transistor (FET), and a storage capacitor with a node contact to one of the two source/drain areas of the FET. The capacitor is used for storing information in binary form (0's and 1's) as electrical charge, and the second source/drain area is connected to a bit line that is used to read and write information via peripheral circuits on the DRAM chip. Word lines that also form the FET gate electrodes are used to randomly access (address) the individual memory cells.

Both trench capacitors formed in the substrate and stacked capacitors formed on the substrate surface over the FET are currently being pursued for DRAM applications. However, the stacked capacitor has received considerable attention in recent years because of the various ways its shape can be changed in the vertical direction to increase capacitance without increasing the area it occupies on the cell area. However, as the cell density increases and the cell size shrink to accommodate more cells, it is necessary to increase the vertical dimension of the stacked capacitor. This is to provide sufficient capacitance to maintain the necessary charge for acceptable sign-to-noise levels and to provide a reasonable refresh cycle times.

Unfortunately, as the stacked capacitors are increased in height the topography across the chip becomes rougher, and the problem associated with reliably exposing the photoresist and etching high-aspect-ratio patterns in the material layers are made more difficult. Although the spaces between the closely spaced capacitors in the memory cell area can be easily filled with an insulator to provide a relatively planar surface, the topography at the perimeter of the array cell near the periphery of the chip can be considerably greater than 1.0 micrometer in height. Another problem is when freestanding bottom electrodes are formed, subsequent processing, such as cleaning and the like, can result in mechanical damage.

Numerous methods for making the stacked capacitors are described in the literature. One approach to forming stacked capacitors is described by Kim et al., U.S. Pat. No. 5,444,005. The method shows a sequence of process steps for forming a multiwalled cylindrical freestanding bottom electrode using multiple sidewall spacers. Another approach for making stacked capacitors is described by Liaw et al. in U.S. Pat. No. 5,543,345, which also uses sidewall spacers for forming freestanding sidewalls for the bottom electrode of a crown capacitor. Still another approach is described by Tseng in U.S. Pat. No. 5,604,146 for an E-shaped crown capacitor using sidewall spacers and a second photoresist mask to etch freestanding bottom electrodes. Dennison et al., U.S. Pat. No. 5,270,241, show a method for forming container stacked capacitors in the node contacts etched in an insulating layer. The insulating layer is then partially etched back, without an etch-stop layer, to leave portions of the insulating layer as a protective layer over the underlying devices.

There is still a need in the semiconductor industry to develop a method for making stacked capacitors that are less susceptible to mechanical damage. There is also a need to provide a process that forms a more planar surface over the substrate for improved high-resolution lithography and residue-free anisotropic etching.

SUMMARY OF THE INVENTION

Accordingly it is a principal object of the present invention to fabricate semicrown capacitors for DRAM chips having an etch-stop layer that partially supports the semicrown-shaped bottom electrodes and to provide a more planar surface to improve the photolithography process window.

A method is described for forming an array of semicrown capacitors with increased capacitance for dynamic random access memory (DRAM) cells. This array of semicrown capacitors are formed on a substrate having partially completed DRAM devices. The partially completed DRAM devices consist of an array of device areas. Each device area has a field effect transistor (FET) consisting of a gate electrode and two source/drain areas. The array of semicrown capacitors are now formed by depositing a planar first insulating layer over the device areas. A second insulating layer, such as silicon nitride ($Si_3N_4$), is deposited as an etch-stop layer. A third insulating layer is deposited. A first photoresist mask and anisotropic plasma etching are used to pattern the third and the second insulating layers to the first insulating layer to form an array of recesses aligned over the array of device areas for the semicrown-shaped bottom electrodes. After removing the first photoresist mask, a second photoresist mask and anisotropic plasma etching are used to etch node contact openings in the first insulating layer exposed in the recesses to one of each source/drain areas in each device area. A conformal doped first polysilicon layer is deposited in the recesses and is sufficiently thick to fill the node contact openings. A fourth insulating layer is deposited to a thickness sufficient to fill the recesses. The fourth insulating layer is then etched back to the first polysilicon layer to form oxide plugs in the recesses. The doped first polysilicon layer is removed to the top surface of the third insulating layer by plasma etching, while the oxide plugs protect the first polysilicon layer in the recesses. Alternatively, the fourth insulating layer and the first polysilicon layer can be chemical/mechanically polished back sequentially to the third insulating layer to replace the two plasma etching steps cited above. The oxide plugs and the third insulating layer are isotropically etched back, for example by using a hydrofluoric acid solution, to the etch-stop layer, which etches much more slowly than the third and fourth insulating layers. This results in an array of bottom electrodes formed from the remaining first polysilicon layer and that are partially supported by the etch-stop layer to form the semicrown capacitor structure. This provides a structure that is less susceptible to mechanical damage during processing. The array of capacitors are now completed by depositing a thin interelectrode dielectric layer on the bottom electrodes and depositing a conformal doped second polysilicon layer which is patterned to form the capacitor top electrodes. A fifth insulating layer, for example a borophosphosilicate glass (BPSG), is then deposited to provide the next level of insulation. The fifth insulating layer is annealed or planarized to provide levelling for a more planar surface. The etch-stop layer that remains around the perimeter of the array of capacitors and across the DRAM chip provides a more planar topography when BPSG is used as the fifth insulating layer. This improves the photolithographic process window for subsequent processing.

BRIEF DESCRIPTION OF THE DRAWINGS

The above object and advantages of this invention are best understood with reference to the attached drawings in the figures.

DESCRIPTION OF THE PREFERRED EMBODIMENT

The present invention describes in detail a method for making an array of semicrown capacitors having increased capacitance. These capacitors are made on a substrate having partially completed DRAM devices. The partially completed DRAM devices consist of an array of device areas, each device area surrounded and electrically isolated by a field oxide (FOX). Each device area has a field effect transistor (FET) consisting of a gate electrode and two source/drain areas. The partial device structures are not explicitly shown in the figures because they are not necessary to describe the invention for making the semicrown-shaped capacitors, and therefore simplify the drawings and discussion. An important feature of the invention is the use of an etch-stop layer that provides additional mechanical support for the capacitors to minimize processing damage. The etch-stop layer around the perimeter of the array of capacitors also provides a more planar surface across the DRAM chip for an improved photolithographic process window.

Figure 1:
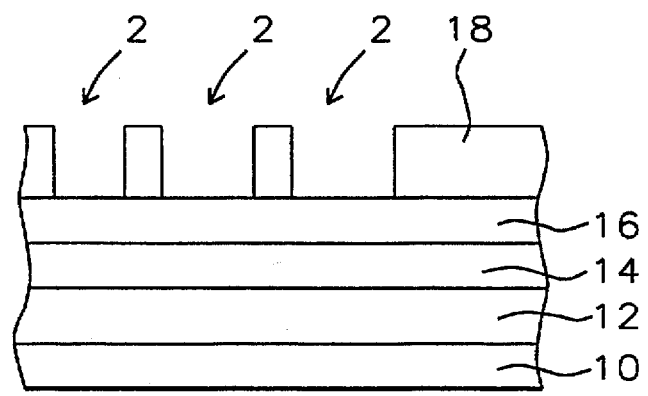
FIGS. 1 through 8 are schematic cross-sectional views through a portion of a DRAM chip at the perimeter of an array of memory cells for the preferred embodiment of the present invention.

Referring first to FIG. 1, the array of semicrown capacitors are now formed by providing a substrate 10 having these partially completed devices (not shown). Typically for DRAM circuits a silicon substrate is used having a <100> crystallographic orientation and is doped P⁻ with boron (B). Next a planar first insulating layer 12 is deposited on the substrate 10. Layer 12 is preferably a silicon oxide ($SiO_2$) and is deposited by low pressure chemical vapor deposition (LPCVD) using tetraethosiloxane and ozone ($TEOS/O_3$) as the reactant gas mixture. $SiO_2$ layer 12 can be planarized using methods commonly practiced in the industry, such as etchback or chemical/mechanical polishing. Alternatively, layer 12 can be a borophosphosilicate glass (BPSG) and can be planarized (levelling) by annealing. The preferred thickness of layer 12 is between about 5000 and 15000 Angstroms.

Still referring to FIG. 1, a second insulating layer 14, preferably a silicon nitride ($Si_3N_4$), is deposited on layer 12 and serves as an etch-stop layer. Layer 14 is preferably deposited by LPCVD using dichlorosilane ($SiCl_2H_2$) and ammonia ($NH_3$) as the reactant gas mixture at a temperature of between about 700 and 800° C. Layer 14 is deposited to a preferred thickness of between about 3000 and 8000 Angstroms. Alternatively, a high-density oxide can also serve as the etch-stop layer 14. A third insulating layer 16 is deposited next. Layer 16 is preferably a high-etch-rate oxide, such as a plasma-enhanced vapor deposited silicon oxide, using silane ($SiH_4$) and oxygen ($O_2$) and deposited at a relatively low temperature, such as at about 200° C. Preferably layer 16 is deposited to a thickness of between about 3000 and 8000 Angstroms.

Referring still to FIG. 1, a first photoresist layer 18 is deposited on the third insulating layer 16. Conventional photolithographic techniques are used to pattern the photoresist layer 18 to form a photoresist mask 18 having openings 2 aligned over the device areas on the substrate (not shown) for the memory cells.

Figure 2:
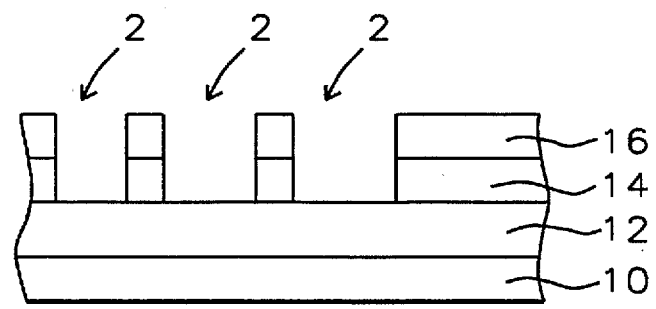

Now as shown in FIG. 2, the photoresist mask 18 is used to anisotropically plasma etch recesses in the third and the second insulating layers 16 and 14 to the first insulating layer 12 in which the bottom electrodes for the semicrown-shaped capacitors will be formed. The etching is preferably carried out in a high-density plasma (HDP) etcher using an etchant gas mixture such as carbon tetrafluoride ($CF_4$), trifluoromethane ($CHF_3$), argon (Ar), and oxygen ($O_2$). The first photoresist mask 18 is then removed, such as by plasma ashing in $O_2$.

Figure 3:
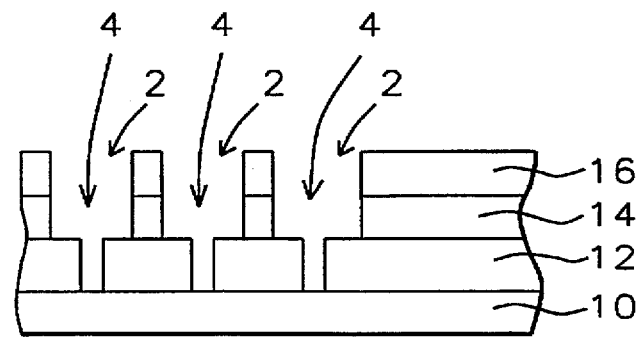

Referring to FIG. 3, conventional photolithographic techniques using a second photoresist mask (not shown) and anisotropic plasma etching are used to etch node contact openings 4 in the first insulating layer 12 within the recesses 2 to one of each source/drain areas in each device area (not shown) on the substrate 10. Preferably the etching is carried out in a HDP etcher using an etchant gas that selectively etches $SiO_2$ to silicon. For example, the etching can be carried out using an etchant gas mixture such as perfluoroisobutylene ($C_4F_8$), carbon monoxide (CO), Ar, and $O_2$.

Figure 4:
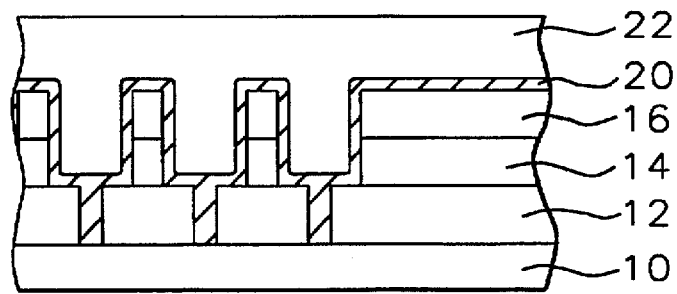

Referring now to FIG. 4, a conformal doped first polysilicon layer 20 is deposited in the recesses 2 and is sufficiently thick to fill the node contact openings 4. Layer 20 is deposited preferably by LPCVD using a reactant gas such as $SiH_4$ and is in-situ doped N⁺ with phosphorus to a preferred concentration of between about 1.0 E 19 and 1.0 E 21 atoms/cm³. Layer 20 is deposited to a preferred thickness of between about 500 and 2000 Angstroms.

Still referring to FIG. 4, a fourth insulating Layer 22 is deposited over the first polysilicon layer 20 and to a thickness sufficient to fill the recesses 2 and to form an essentially surface. Layer 22 is preferably a $SiO_2$ deposited at low temperature, and having a fast etch rate relative to the underlying second insulating layer 14, composed of $Si_3N_4$ or alternatively composed of the high-density $SiO_2$. For example, layer 22 can be deposited using plasma-enhanced CVD using $SiH_4$ and $O_2$ as the reactant gas mixture and at a temperature of about 200° C. The preferred thickness of layer 22 is between about 1500 and 5000 Angstroms.

Figure 5:
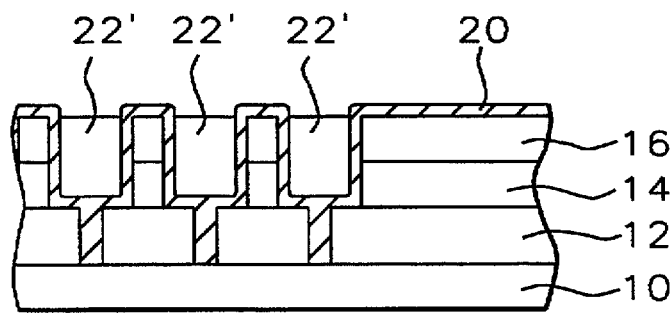

Referring to FIG. 5, the fourth insulating layer 22 is then selectively etched back to the first polysilicon layer 20 to form silicon oxide plugs 22' in the recesses 2. For example, layer 22 can be etched back using reactive ion etching (RIE) or HDP etching and an etchant gas mixture such as $CF_4$, $CHF_3$, Ar, and $O_2$.

Figure 6:
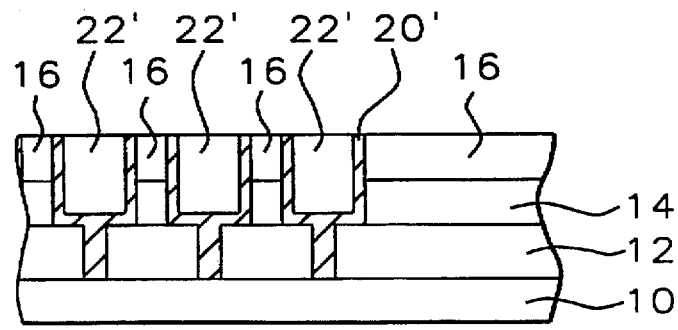

Now as shown in FIG. 6, the doped first polysilicon layer 20 is plasma etched back to the top surface of the third insulating layer 16. The silicon oxide plugs 22' protect the first polysilicon layer in the recesses 2. This results in an array of bottom electrodes 20' formed from first polysilicon layer 20 in the recesses 2. Preferably the first polysilicon layer 20 is etched back selectively to the third insulating layer 16 using RIE or HDP etching and an etchant gas mixture containing chlorine such as $Cl_2$, hydrogen bromide (HBr) and $O_2$.

Alternatively the two etch-back steps used to etch back layers 22 and 20 can be replaced by a single chemical/mechanical polish-back step. Layers 22 and 20 can be polished back sequentially to the surface of the third insulating layer 16, also resulting in the structure shown in FIG. 6. The CMP process provides a more cost-effective manufacturing process.

Figure 7:
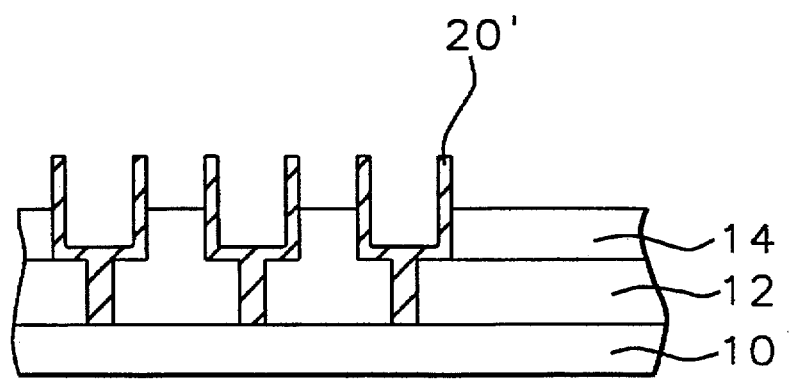

Referring to FIG. 7, the silicon oxide plugs 22' and the third insulating layer 16, which are a disposable oxide, are removed in an isotropic wet etch. For example, the wet etch can be carried out in a dilute solution of water ($H_2O$) and hydrofluoric (HF) acid, such as in a solution of 100:1 of $H_2O$:HF. The plugs 22' and layer 16, formed at low temperature and having a high etch rate, are completely removed while the etch stop layer, composed of silicon nitride or a high-density silicon oxide remain essentially unetched. For example, the etch-rate ratio for the low temperature oxide (PECVD oxide) to the high-density TEOS oxide in HF:$H_2O$ (1:100) can be greater than 13 to 1, while the etch-rate ratio is even greater when $Si_3N_4$ is used as the etch-stop layer 14.

The remaining etch-stop layer 14 provides mechanical support for the capacitor bottom electrode 20' to form a semicrown capacitor structure, as shown in FIG. 7. The semicrown structure reduces the probability of mechanical damage during subsequent processing. Also, as shown later, the remaining etch-stop layer 14 improves the uniformity across the substrate to provide a greater photolithographic process window.

Figure 8:
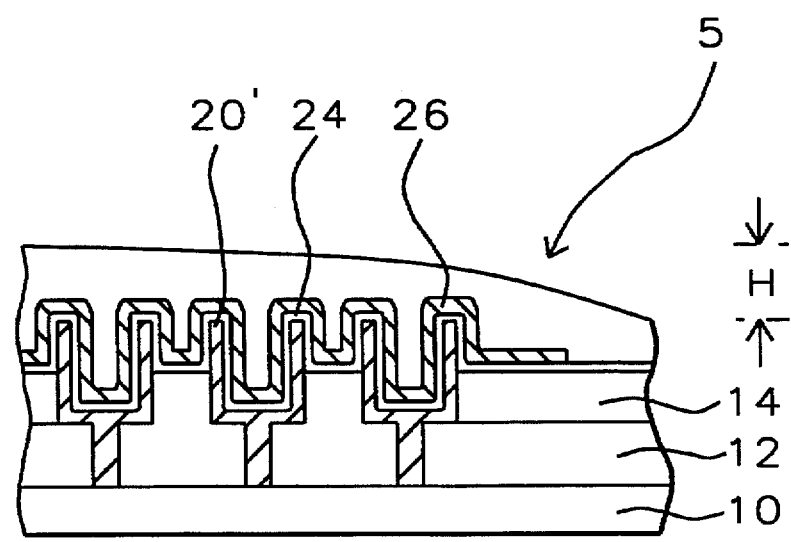

Continuing, and referring now to FIG. 8, the array of semicrown shaped capacitors are completed by forming a thin interelectrode dielectric layer 24 having a high dielectric constant on the surface of the bottom electrodes 20'. Layer 24 is preferably composed of layers of $SiO_2/Si_3N_4/SiO_2$ (ONO). The ONO dielectric can be formed on the polysilicon bottom electrodes 20' by growing a thermal oxide, depositing a $Si_3N_4$ layer by LPCVD, and then using an oxidation furnace to form the top $SiO_2$ by partially reducing the $Si_3N_4$ layer. Preferably the ONO is formed having a thickness of between about 30 and 60 Angstroms. Alternatively, layer 24 can be composed of other high-dielectric constant materials, such as tantalum pentoxide ($Ta_2O_5$) or barium strontium titanium oxide BST(BaSr)$TiO_3$, or can be used in conjunction with ONO to form the high-dielectric-constant layer 24.

Referring still to FIG. 8, a conformal, in-situ doped fourth polysilicon layer 20 is deposited, for example by LPCVD using a reactant gas such as $SiH_4$, and using a dopant gas such as $PH_3$. Layer 26 is doped $N^+$ to a preferred concentration of between about 1.0 E 19 and 1.0 E 21 atoms/$cm^3$. The preferred thickness of layer 26 is between about 500 and 2000 Angstroms. The fourth polysilicon layer 26 is then patterned to form the top electrodes 26 to complete the array of semicrown-shaped capacitors on dynamic random access memory (DRAM) chips.

Still referring to FIG. 8, a fifth insulating layer 28 is deposited on the substrate and over the array of semicrown-shaped capacitors for the DRAM chips. Layer 28 is preferably BPSG deposited by LPCVD using TEOS and doped with boron and phosphorus using appropriate dopant gases. The BPSG is then annealed to provide leveling of the glass over the edge 5 at the perimeter of the array of capacitors. As can be seen in FIG. 8, when the etch-stop layer 14 is retained in this semicrown shaped capacitor structure the step height H is reduced by the thickness of layer 14. This provides a more planar surface which is important for subsequent processing steps. For example, high-resolution submicrometer technologies require exposing the photoresist with a shallow depth of focus (DOF) and therefore requires a planar surface to form distortion-free images in the photoresist. Also the reduced step height H minimizes the residue at the edges of steps (stringers) when the next level of metal interconnections are patterned by anisotropic etching, thereby reducing intralevel electrical shorts.

While the invention has been particularly shown and described with reference to the preferred embodiment thereof, it will be understood by those skilled in the art that various changes in form and details may be made without departing from the spirit and scope of the invention.

What is claimed is:

1. A method for making an array of semicrown stacked capacitors for memory cells on dynamic random access memory (DRAM) devices on a substrate comprising the steps of:

providing a semiconductor substrate having an array of device areas and each of said device areas having a field effect transistor (FET) with a gate electrode and two source/drain areas, and further having a planar first insulating layer over said device areas;

depositing a second insulating layer as an etch-stop layer;

depositing a third insulating layer;

using a first photoresist mask and anisotropic plasma etching to pattern said third and said second insulating layers to said first insulating layer to form an array of recesses aligned over said array of device areas for bottom electrodes, and removing said first photoresist mask;

anisotropic plasma etching node contact openings in said first insulating layer in said recesses to one of said source/drain areas in each of said device areas by using a second photoresist mask;

depositing a conformal doped first polysilicon layer in said recesses and sufficiently thick to fill said node contact openings;

depositing a fourth insulating layer sufficient to fill said recesses;

removing said fourth insulating layer to said first polysilicon layer to form oxide plugs in said recesses and thereby exposing said doped first polysilicon layer on the top surface of said third insulating layer;

selectively removing said doped first polysilicon layer to the top surface of said third insulating layer;

isotropically etching said oxide plugs and said third insulating layer to said etch-stop layer to form said bottom electrodes for said array of device areas, wherein said etch-stop layer supports said bottom electrodes of said semicrown stacked capacitors;

forming an interelectrode dielectric layer on said bottom electrodes;

depositing a conformal doped second polysilicon layer over said interelectrode dielectric layer;

patterning said second polysilicon layer to form capacitor top electrodes to complete said array of semicrown stacked capacitors.

2. The method of claim 1, wherein said planar first insulating layer is a silicon oxide and has a thickness of between about 5000 and 15000 Angstroms over said device areas.

3. The method of claim 1, wherein said second insulating layer is silicon nitride and has a thickness of between about 3000 and 8000 Angstroms.

4. The method of claim 1, wherein said third insulating layer is silicon oxide and has a thickness of between about 3000 and 8000 Angstroms.

5. The method of claim 1, wherein said first polysilicon layer is doped $N^+$ with phosphorus to a concentration of between 1.0 E 19 and 1.0 E 21 atoms/$cm^3$.

6. The method of claim 1, wherein said first polysilicon layer is deposited to a thickness of between about 500 and 2000 Angstroms.

7. The method of claim 1, wherein said fourth insulating layer is a borophosphosilicate glass and is deposited to a thickness of between about 1500 and 5000 Angstroms.

8. The method of claim 7, wherein said borophosphosilicate glass is annealed to provide a planar surface.

9. The method of claim 1, wherein said fourth insulating layer and said first polysilicon layer on said top surface of said third insulating layer are removed by chemical/mechanical polishing.

10. The method of claim 1, wherein said fourth insulating layer and said first polysilicon layer on said top surface of said third insulating layer are removed by plasma etching.

11. The method of claim 1, wherein said isotropic etching of said oxide plugs and said third insulating layer is carried out using a hydrofluoric acid solution while said etch-stop layer remains to partially support said semicrown stacked capacitors.

12. The method of claim 1, wherein said interelectrode dielectric layer is composed of a high-dielectric constant material.

13. The method of claim 12, wherein said high-dielectric constant material is tantalum pentoxide.

14. The method of claim 12, wherein said high-dielectric constant material is barium strontium titanium oxide (BaSr) $TiO_3$.

15. The method of claim 12, wherein said high-dielectric constant material is silicon oxide/silicon nitride/silicon oxide (ONO).

16. The method of claim 1, wherein said second polysilicon layer is conductively doped $N^+$ with phosphorus to a concentration of between 1.0 E 19 and 1.0 E 21 atoms/$cm^3$, and is deposited to a thickness of between about 500 and 2000 Angstroms.

17. A method for making an array of semicrown stacked capacitors in memory cells on dynamic random access memory (DRAM) devices on a substrate comprising the steps of:

providing a semiconductor substrate having an array of device areas and each of said device areas having a field effect transistor (FET) with a gate electrodes and two source/drain areas, and further having a planar first insulating layer over said device areas;

depositing a second insulating layer as an etch-stop layer;

depositing a third insulating layer;

using a first photoresist mask and anisotropic plasma etching to pattern said third and said second insulating layers to said first insulating layer to form an array of recesses aligned over said array of device areas for bottom electrodes, and removing said first photoresist mask;

anisotropic plasma etching node contact openings in said first insulating layer in said recesses to one of said source/drain areas in each of said device areas by using a second photoresist mask;

depositing a conformal doped first polysilicon layer in said recesses and sufficiently thick to fill said node contact openings;

depositing a fourth insulating layer sufficient to fill said recesses;

chemical/mechanical polishing back said fourth insulating layer and said first polysilicon layer on the top surface of said third insulating layer thereby forming oxide plugs in said recesses and exposing said top surface of said third insulating layer;

isotropically etching said oxide plugs and said third insulating layer to said etch-stop layer to form said bottom electrodes for said array of device areas, wherein said etch-stop layer supports said bottom electrodes of said semicrown stacked capacitors;

forming an interelectrode dielectric layer on said bottom electrodes;

depositing a conformal doped second polysilicon layer over said interelectrode dielectric layer;

patterning said second polysilicon layer to form capacitor top electrodes to complete said array of semicrown stacked capacitors.

18. The method of claim 17, wherein said planar first insulating layer is a silicon oxide and has a thickness of between about 5000 and 15000 Angstroms over said device areas.

19. The method of claim 17, wherein said second insulating layer is silicon nitride and has a thickness of between about 3000 and 8000 Angstroms.

20. The method of claim 17, wherein said third insulating layer is silicon oxide and has a thickness of between about 3000 and 8000 Angstroms.

21. The method of claim 17, wherein said first polysilicon layer is doped $N^+$ with phosphorus to a concentration of between 1.0 E 19 and 1.0 E 21 atoms/$cm^3$.

22. The method of claim 17, wherein said first polysilicon layer is deposited to a thickness of between about 500 and 2000 Angstroms.

23. The method of claim 17, wherein said fourth insulating layer is a borophosphosilicate glass and is deposited to a thickness of between about 1500 and 5000 Angstroms.

24. The method of claim 23, wherein said borophosphosilicate glass is annealed to provide a planar surface.

25. The method of claim 17, wherein said isotropic etching of said oxide plugs and said third insulating layer is carried out using a hydrofluoric acid solution while said etch-stop layer remains to partially support said semicrown stacked capacitors.

26. The method of claim 17, wherein said interelectrode dielectric layer is composed of a high-dielectric constant material.

27. The method of claim 26, wherein said high-dielectric constant material is tantalum pentoxide.

28. The method of claim 26, wherein said high-dielectric constant material is barium strontium titanium oxide (BaSr) $TiO_3$.

29. The method of claim 26, wherein said high-dielectric constant material is silicon oxide/silicon nitride/silicon oxide (ONO).

30. The method of claim 17, wherein said second polysilicon layer is conductively doped $N^+$ with phosphorus to a concentration of between 1.0 E 19 and 1.0 E 21 atoms/$cm^3$, and is deposited to a thickness of between about 500 and 2000 Angstroms.

* * * * *